United States Patent (10) Patent No.: US 9,936,606 B1
Kosugi et al. (45) Date of Patent: Apr. 3, 2018

(54) LIQUID IMMERSION COOLER (71) Applicant: FUJITSU LIMITED, Kawasaki-shi, Kanagawa (JP)

(72) Inventors: Naofumi Kosugi, Yokohama (JP); Takashi Yamamoto, Nerima (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/480,430

(22) Filed: Apr. 6, 2017

(30) Foreign Application Priority Data

Jan. 30, 2017 (JP) ................................. 2017-014841

(51) Int. Cl.
*H05K 7/20* (2006.01)
*C09K 5/04* (2006.01)
*H01L 23/473* (2006.01)

(52) U.S. Cl.
CPC ......... *H05K 7/20236* (2013.01); *C09K 5/041* (2013.01); *H05K 7/20272* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 6,351,071 B1* | 2/2002 | Itoh | H01J 23/005 315/39.51 |
| 8,619,425 B2* | 12/2013 | Campbell | H05K 7/20809 165/80.4 |
| 2003/0063438 A1* | 4/2003 | Morris | H01L 23/4735 361/699 |
| 2007/0256810 A1* | 11/2007 | Di Stefano | H01L 23/473 165/46 |
| 2008/0129970 A1* | 6/2008 | Furukawa | G03F 7/70341 355/30 |

(Continued)

FOREIGN PATENT DOCUMENTS

JP 2011-518395 A 6/2011
JP 2016-046431 4/2016

OTHER PUBLICATIONS

Japanese Office Action dated Aug. 29, 2017 for corresponding Japanese Patent Application No. 2017-014841, with English Translation, 7 pages.

(Continued)

*Primary Examiner* — Anthony Haughton
*Assistant Examiner* — Razmeen Gafur
(74) *Attorney, Agent, or Firm* — Fujitsu Patent Center (57) ABSTRACT A liquid immersion cooler including: a refrigerant tank that stores a silicone oil-based insulating refrigerant immersing an electronic device; a circulation passage that is provided between the refrigerant tank and a refrigerant cooler, and through which the silicone oil-based insulating refrigerant flows; and a pump that is arranged on the circulation passage, and circulates the silicone oil-based insulating refrigerant between the refrigerant tank and the refrigerant cooler.

5 Claims, 5 Drawing Sheets

(56) References Cited

U.S. PATENT DOCUMENTS

| | | | | |
|---|---|---|---|---|
| 2008/0296147 A1* | 12/2008 | Jaksic | B82Y 30/00 | 204/173 |
| 2009/0260777 A1* | 10/2009 | Attlesey | G06F 1/20 | 165/67 |
| 2010/0252066 A1* | 10/2010 | Kaiser | B08B 3/02 | 134/1 |
| 2010/0263404 A1* | 10/2010 | Shiotani | F01C 13/04 | 62/468 |
| 2010/0320635 A1* | 12/2010 | Ota | C23C 18/1682 | 264/129 |
| 2011/0003402 A1* | 1/2011 | Chakrapani | H01L 21/31058 | 438/4 |
| 2011/0048058 A1* | 3/2011 | Narayanamurthy | F24F 5/0017 | 62/434 |
| 2011/0080567 A1* | 4/2011 | Hoekerd | G03F 7/70341 | 355/30 |
| 2011/0122128 A1* | 5/2011 | Akita | G02B 27/2214 | 345/419 |
| 2011/0140820 A1* | 6/2011 | Guentert, III | H01F 27/12 | 336/58 |
| 2011/0167856 A1* | 7/2011 | Seo | G06F 1/20 | 62/259.2 |
| 2012/0320527 A1* | 12/2012 | Nishiura | H05K 7/20218 | 361/699 |
| 2013/0181826 A1* | 7/2013 | Yang | H01M 10/4228 | 340/455 |
| 2013/0240185 A1* | 9/2013 | Katoh | F28D 1/0426 | 165/140 |
| 2014/0262413 A1* | 9/2014 | McCleary | H01B 11/12 | 174/47 |
| 2015/0062806 A1* | 3/2015 | Shelnutt | H05K 7/203 | 361/679.53 |
| 2015/0101352 A1* | 4/2015 | Kwak | H05K 7/2039 | 62/3.1 |
| 2015/0109730 A1* | 4/2015 | Campbell | H05K 7/20809 | 361/679.53 |
| 2015/0109735 A1* | 4/2015 | Campbell | H05K 7/20318 | 361/700 |
| 2015/0195953 A1* | 7/2015 | Best | H05K 7/20763 | 165/11.1 |
| 2015/0292820 A1* | 10/2015 | Katoh | F25B 39/04 | 165/140 |
| 2015/0338173 A1* | 11/2015 | Katoh | F28F 9/0278 | 165/172 |
| 2016/0187041 A1* | 6/2016 | Yoshikawa | F25B 1/10 | 62/81 |
| 2016/0231663 A1* | 8/2016 | Inaba | G03G 9/131 | |
| 2016/0363351 A1* | 12/2016 | Kawano | F25B 1/08 | |

OTHER PUBLICATIONS

Endo Toshio, "Tsubame-KFC: Ultra Green Super Computer Research Facility Using Liquid Immersion", Scientific International Information Center of Tokyo Institute of Technology, Surpercomputing 13 (SC 13), Nov. 2013 (56 pages).

Barrel silicon fluid M-20E (silicone oil based insulating oil). Retrieved from the Internet Mar. 7, 2017, <http://www.matsumura-oil.co.jp/products/prdc/brl_th_bsf-m20e.htm> (2 pages), with English translation.

Barrel silicon fluid M series (Silicone oil), Retrieved from the internet Mar. 7, 2017, <http://www.matsumura-oil.co.jp/products/prdc/brl_si_m.htm> (8 pages), with English translation.

3M Fluorinert Electronic Liquid FC-3283, http://multimedia.3m.com/mws/media/64886O/fluorinert-electronic-liquid-fc-3283.pdf, Issued: Aug. 2001 (4 pages).

* cited by examiner

|  | SILICONE OIL-BASED INSULATING REFRIGERANT | VEGETABLE OIL-BASED INSULATING REFRIGERANT | | FLUORINE-BASED INSULATING REFRIGERANT |
|---|---|---|---|---|
|  | M-20E | VEGETABLE OIL A | VEGETABLE OIL B | FC-3283 |
| DENSITY [g/cm³] | 0.96 | 0.86 | 0.921 | 1.83 |
| THERMAL CONDUCTIVITY AT 25 °C [w/m·K] | 0.149 | 0.132 | 0.176 | 0.067 |
| KINETIC VISCOSITY AT 25 °C [cSt] | 20 | 5.1 | 34.81 | 0.8 |

FIG. 3A

EXAMPLE OF EYE PATTERN IN AIR

FIG. 3B

EXAMPLE OF EYE PATTERN IN M-20E

FIG. 3C

EXAMPLE OF EYE PATTERN IN VEGETABLE OIL A

FIG. 3D

EXAMPLE OF EYE PATTERN IN VEGETABLE OIL B

FIG. 3E

EXAMPLE OF EYE PATTERN IN FC-3283

FIG. 4

|  |  | KINETIC VISCOSITY [cSt] | FLOW RATE [L/min] |
|---|---|---|---|
| FC-3283 | 25 °C | 0.8 | 100 |
| M-20E | 0 °C | 36.0 | 86 |
|  | 20 °C | 21.9 | 91 |
|  | 40 °C | 14.5 | 96 |

LIQUID IMMERSION COOLER

CROSS-REFERENCE TO RELATED APPLICATION

This application is based upon and claims the benefit of priority of the prior Japanese Patent Application No. 2017-014841, filed on Jan. 30, 2017, the entire contents of which are incorporated herein by reference.

FIELD

A certain aspect of embodiments described herein relates to a liquid immersion cooler.

BACKGROUND

There has been conventionally known a cooling system of an electronic device using a fluorocarbon-based coolant (see e.g. Patent Document 1: Japanese Laid-open Patent Publication No. 2016-46431).

SUMMARY

According to an aspect of the present invention, there is provided a liquid immersion cooler including: a refrigerant tank that stores a silicone oil-based insulating refrigerant immersing an electronic device; a circulation passage that is provided between the refrigerant tank and a refrigerant cooler, and through which the silicone oil-based insulating refrigerant flows; and a pump that is arranged on the circulation passage, and circulates the silicone oil-based insulating refrigerant between the refrigerant tank and the refrigerant cooler.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

A fluorine-based insulating refrigerant such as a fluorocarbon-based coolant used in the Patent Document 1 has high permeability generally, erodes a sealing material used for an axial flow pump and might cause refrigerant leakage. For this reason, an available pump is limited. Moreover, a density of the fluorine-based insulating refrigerant used by a cooling system with operational results is high with around 1.8 g/cm$^3$, for example, the weight of the whole cooling system becomes very heavy, and hence a load resistance of the setting floor of the cooling system has to be enhanced. In addition, the fluorine-based insulating refrigerant is evaporable, so that the complement of the fluorine-based insulating refrigerant and structure for suppressing the evaporation thereof are required, which increases a cost. Also, the fluorine-based insulating refrigerant itself is expensive. Thus, with respect to the operation of the cooling system using the fluorine-based insulating refrigerant, matters which a system operator should consider diverge into many branches. The matters are caused all by the characteristic of the refrigerant.

A description will now be given of embodiment of the present invention with reference to attached drawings. It should be noted that a size and a ratio of each element do not correspond to the actual ones in some drawings. Also, some elements which exist in fact may be omitted in some drawings and the sizes of some elements may be illustrated exaggeratingly compared with the actual ones, for convenience of explanation.

Embodiment

Figure 1:
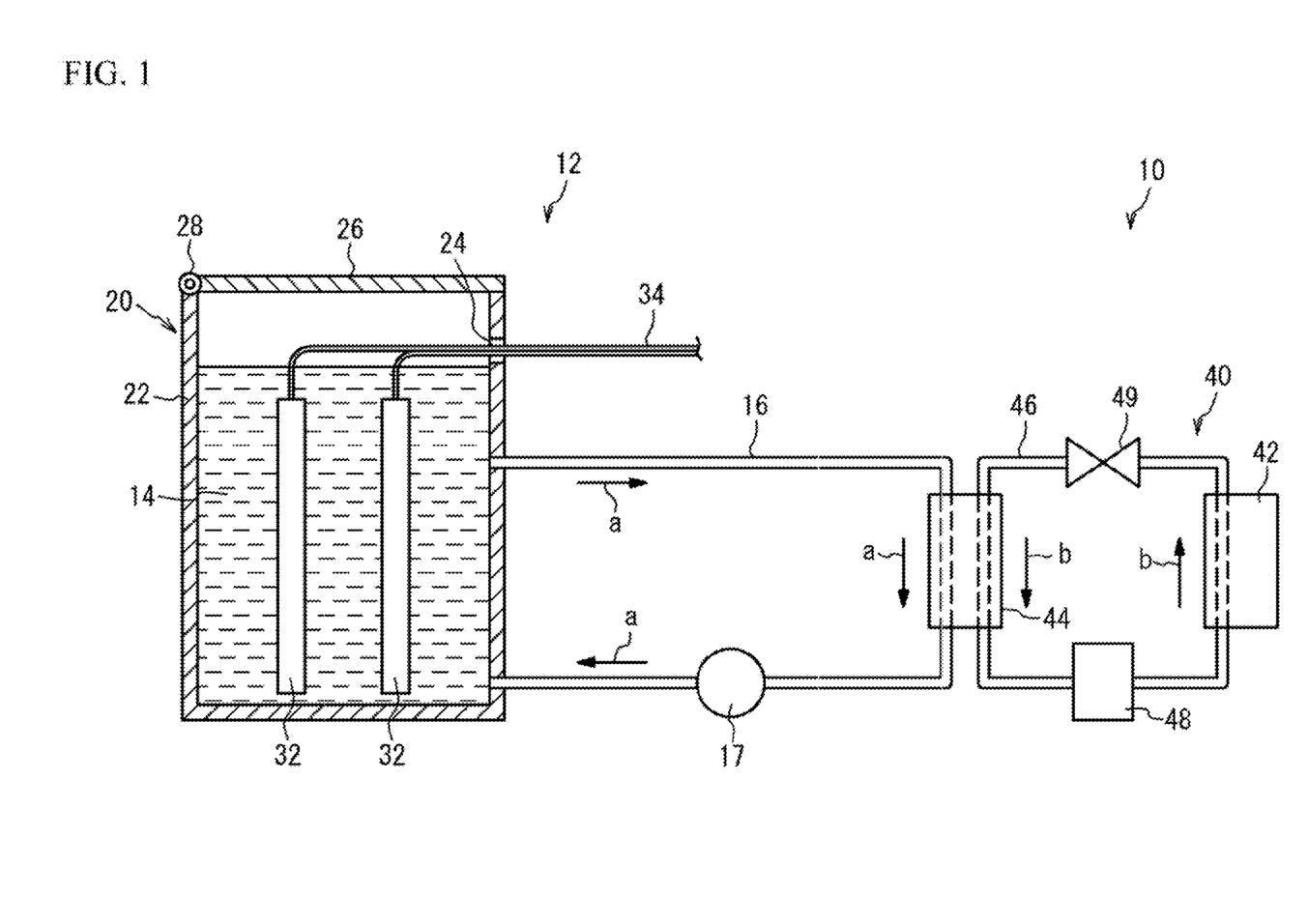
FIG. 1 is a diagram illustrating the configuration of a liquid immersion cooling system into which a liquid immersion cooler according to an embodiment is embedded.

First, a description will be given of schematic configuration of a liquid immersion cooling system 10 including a liquid immersion cooler 12 according to an embodiment, with reference to FIG. 1. FIG. 1 is a diagram illustrating the configuration of the liquid immersion cooling system 10 into which the liquid immersion cooler 12 according to the embodiment is embedded.

Liquid Immersion Cooling System

As illustrated in FIG. 1, the liquid immersion cooling system 10 according to the embodiment includes the liquid immersion cooler 12 and a refrigerant cooler 40. The liquid immersion cooler 12 includes a refrigerant tank 20 as described later in detail, and a circulation passage 16 connected between the refrigerant tank 20 and the refrigerant cooler 40.

Liquid Immersion Cooler

As illustrated in FIG. 1, the liquid immersion cooler 12 includes the refrigerant tank 20. The refrigerant tank 20 is a container containing a silicone oil-based insulating refrigerant (hereinafter referred to as "a refrigerant liquid") 14. Also, electronic devices 32 as objects to be cooled are contained in the refrigerant tank 20. The electronic devices 32 are immersed into the refrigerant liquid 14 in the refrigerant tank 20.

For example, each of the electronic devices 32 is a server having a printed board on which a plurality of electronic components are mounted, and a housing which houses the printed board. Cables 34 are electrically connected to the printed board of the electronic devices 32.

The refrigerant tank 20 includes a refrigerant tank body part 22 whose upper edge is opened, and a refrigerant tank lid part 26 that is openably and closably provided on the upper edge of the refrigerant tank body part 22. A cable outlet 24 is formed on an outer peripheral wall of the refrigerant tank body part 22. The cables 34 connected to the electronic device 32 are led out to the outside of the refrigerant tank 20 through the cable outlet 24. In the liquid immersion cooler 12 using the fluorine-based insulating refrigerant with the operational results, the refrigerant tank 20 may be made into an airtight container in consideration of the fluorine-based insulating refrigerant being evaporable, but an accurate airtight state is not required for the refrigerant tank 20 of the present embodiment. This is because the refrigerant liquid 14 used in the present embodiment is less in an evaporation quantity than the fluorine-based insulating refrigerant.

The refrigerant liquid 14 is stored into the refrigerant tank body part 22 so as not to leak out from the cable outlet 24. The refrigerant liquid 14 has an electrical insulating property and a thermal conductivity. In the present embodiment, barrels Silicone Fluid M-20E (hereinafter, merely referred to as "M-20E") of Matsumura Oil Co., Ltd. is used as the refrigerant liquid 14. Since the refrigerant liquid 14 has the electrical insulating property, the refrigerant liquid 14 can be used to immerse and cool the electronic device 32. The refrigerant liquid 14 is explained later in detail.

The refrigerant tank lid part 26 is mounted on the upper edge of the refrigerant tank body part 22 via a hinge 28. The refrigerant tank lid part 26 rotates around the hinge 28 against the refrigerant tank body part 22, and hence an opening provided on the upper edge of the refrigerant tank body part 22 is opened and closed.

The refrigerant cooler 40 is connected to the refrigerant tank 20 via the circulation passage 16. The circulation passage 16 circulates the refrigerant liquid 14 between the refrigerant tank 20 and the refrigerant cooler 40. For this reason, the circulation passage 16 is formed with pipes through which the refrigerant liquid 14 flows. Moreover, a pump 17 is provided on the circulation passage 16. When the pump 17 is driven, the refrigerant liquid 14 is circulated between the refrigerant tank 20 and the refrigerant cooler 40. Here, an arrow "a" illustrated in FIG. 1 indicates a circulation direction of the refrigerant liquid 14.

The pump 17 according to the embodiment is an axial flow pump, but an extension pump or a mixed flow pumps which generally circulates may be used. That is, in the present embodiment, a range of selection of the pump is widened, and an appropriate pump can be adopted depending on performance required from the liquid immersion cooling system 10. On the contrary, when the fluorine-based insulating refrigerant is used, the range of selection of the pump narrows. This is because the fluorine-based insulating refrigerant has high permeability, and when a pump having a seal material is adopted to a circulation domain of the refrigerant liquid, the fluorine-based insulating refrigerant erodes the seal material and might cause refrigerant leakage. For this reason, when the fluorine-based insulating refrigerant is used as the refrigerant liquid, the use of a pump, such as a magnet pump and a canned pump, having no erosion possibility of the seal material is recommended, for example. However, these pumps have a problem that they are weaker in a driving force than the axial flow pump and are hard to get the flow rate per unit time of the refrigerant liquid. In the case of the liquid immersion cooler 12, the range of selection of the pump is widened without being restricted in the pump selection due to the characteristic of the refrigerant liquid.

Refrigerant Cooler

For example, the refrigerant cooler 40 is a freezer that cools the refrigerant liquid 14 using a frozen cycle. The refrigerant liquid 14 cooled by the refrigerant cooler 40 and the electronic device 32 perform heat exchange, so that the electronic device 32 is cooled.

Specifically, the refrigerant cooler 40 includes a condenser 42 and a heat exchanger 44. The condenser 42 and the heat exchanger 44 are connected to each other via a refrigerant circulation passage 46. The refrigerant circulation passage 46 is formed with pipes through which a refrigerant flows. Here, an arrow "b" illustrated in FIG. 1 indicates a circulation direction of the refrigerant.

Moreover, a compressor 48 is provided on the refrigerant circulation passage 46. The compressor 48 compresses the refrigerant in a vapor-phase state flowing from the heat exchanger 44 to the condenser 42. The condenser 42 includes a cooling fan, not shown, that cools the refrigerant in the vapor-phase state compressed by the compressor 48. The cooling fan cools the refrigerant in the vapor-phase state, so that the refrigerant is condensed.

Moreover, an expansion valve 49 is provided on the refrigerant circulation passage 46. The expansion valve 49 expands the refrigerant in a liquid-phase state flowing from the condenser 42 to the heat exchanger 44 and decompresses the refrigerant. The heat exchanger 44 performs the heat exchange between the refrigerant in the liquid-phase state decompressed by the expansion valve 49 and the refrigerant liquid 14 flowing through the circulation passage 16, and vaporizes the refrigerant. Thereby, vaporization latent heat of the refrigerant is taken from the refrigerant liquid 14, and the refrigerant liquid 14 is cooled.

The refrigerant vaporized by the heat exchanger 44 is compressed by the compressor 48, and then the refrigerant is condensed by the above-mentioned condenser 42. Thus, the refrigerant is circulated through the compressor 48, the condenser 42, the expansion valve 49 and the heat exchanger 44, so that the refrigerant liquid 14 is cooled.

The refrigerant cooler 40 may be other configuration as long as a cooler having the other configuration can cool the refrigerant liquid 14.

The above is the schematic configuration of the liquid immersion cooling system 10 according to the present embodiment. Here, a description will be given of the refrigerant liquid 14 used in the present embodiment in detail. The refrigerant liquid 14 according to the present embodiment is the silicone oil-based insulating refrigerant. It is desirable that when the liquid immersion cooling system 10 is operated, the temperature of the refrigerant liquid 14 in the refrigerant tank 20 is equal to or mote than 0° C. When the liquid immersion cooling system 10 is operated actually, the temperature of the refrigerant liquid 14 is managed so that an operation guarantee temperature of the electronic device 32 is achieved. When the operation guarantee temperature of the electronic device 32 is set in the range of 5-40° C., the temperature of the refrigerant liquid 14 is managed in the range of 0-40° C., and hence it is possible to operate the electronic device 32 under an appropriate temperature environment.

Here, a description will be given of the selection of the refrigerant liquid 14 while comparing with comparative examples. First, one of the comparison example is the fluorine-based insulating refrigerant with the operational results by the liquid immersion cooling system. Specifically, the fluorine-based insulating refrigerant is Fluorinert FC-3283 (hereinafter merely referred to as "FC-3283") of 3M Limited. Moreover, vegetable oils A and B as vegetable oil-based insulating refrigerants are the other comparative examples. The vegetable oil-based insulating refrigerant is more advantageous in permeability than the fluorine-based insulating refrigerant, and therefore the range of selection of the pump is widened like the silicone oil-based insulating refrigerant.

Figure 2:
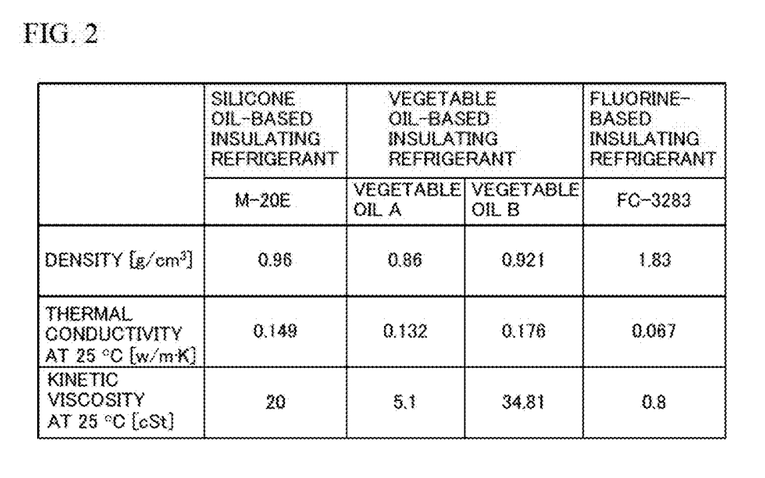
FIG. 2 is a table illustrating characteristics of a refrigerant liquid used for the liquid immersion cooler according to the embodiment along with characteristics of refrigerant liquids of comparative examples.

Referring to the table of FIG. 2, the density of the FC-3283 is 1.83 g/cm$^3$, and is very heavy. For this reason, when the FC-3283 is adopted as the refrigerant liquid, the load resistance of the setting floor of the cooling system has to be enhanced and therefore an operation cost increases. On the contrary, the density of the M-20E is 0.96 g/cm$^3$ and is lighter than the FC-3283. The density of the vegetable oil A is 0.86 g/cm$^3$ and the density of the vegetable oil B is 0.921 g/cm$^3$. These vegetable oil-based insulating refrigerants are also more advantageous in weight than the FC-3283.

A thermal conductivity at 25° C. within the operation guarantee temperature of the electronic device 32 with respect to the vegetable oil A is 0.132 w/m·K, and the thermal conductivity at 25° C. with respect to the vegetable oil B is 0.176 w/m·K. It is considered that there is no great difference between these thermal conductivities and the thermal conductivity of the M-20E which is 0.149 w/m·K. Here, the thermal conductivity of the FC-3283 is 0.067 w/m·K.

Next, a kinetic viscosity at 25° C. within the operation guarantee temperature of the electronic device 32 with respect to the M-20E is 20 cSt, the kinetic viscosity at 25° C. with respect to the vegetable oil A is 5.1 cSt, and the kinetic viscosity at 25° C. with respect to the vegetable oil A is 34.81 cSt. These values are higher than the kinetic viscosity of 0.8 cSt at 25° C. with respect to the FC-3283. In the case of the FC-3283, the range of selection of the pump is limited. When the magnet pump is adopted for example, the driving force of the magnet pump is small. Therefore, a low kinetic viscosity is convenient to secure a necessary flow rate. When the kinetic viscosities of the M-20E and the vegetable oils A and B are also low, it is easy to improve the flow rate. However, the M-20E and the vegetable oils A and B can afford to select a pump having a large driving force and can secure the necessary flow rate. Therefore, even when the kinetic viscosities of the M-20E and the vegetable oils A and B are higher than the kinetic viscosity of the FC-3283, the M-20E and the vegetable oils A and B can secure the necessary flow rate.

According to the above-mentioned consideration, all of the M-20E and the vegetable oils A and B can be a candidate of the refrigerant liquid.

Figure 3A:
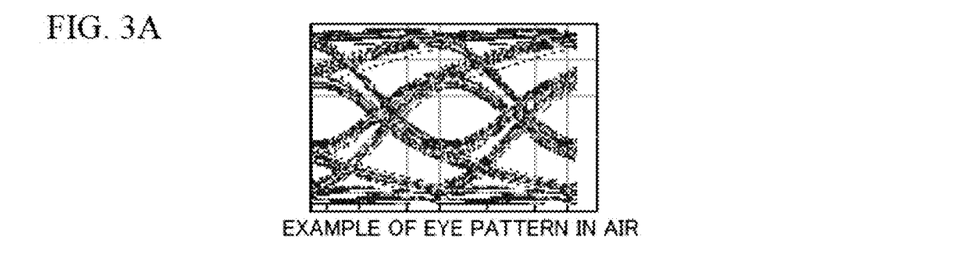
FIGS. 3A to 3E are diagrams illustrating examples of eye patterns of various refrigerant liquids used for the liquid immersion cooler, respectively.
Figure 3B:
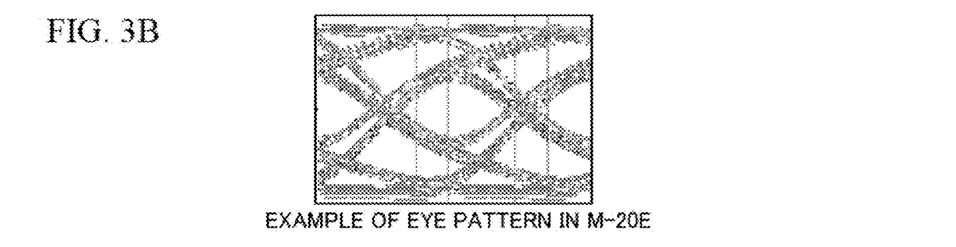
Figure 3C:
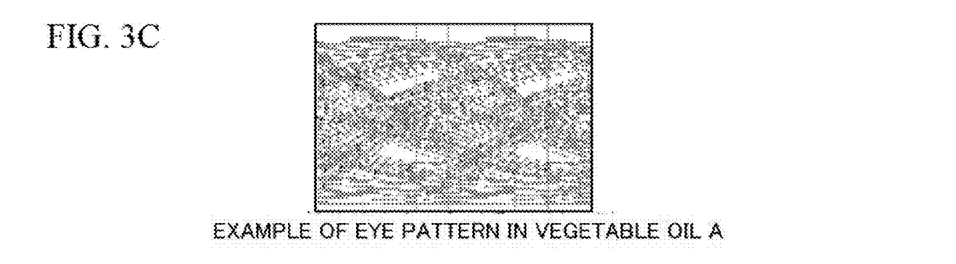
Figure 3D:
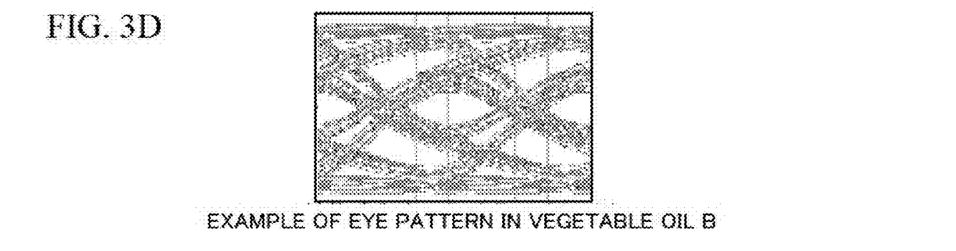
Figure 3E:
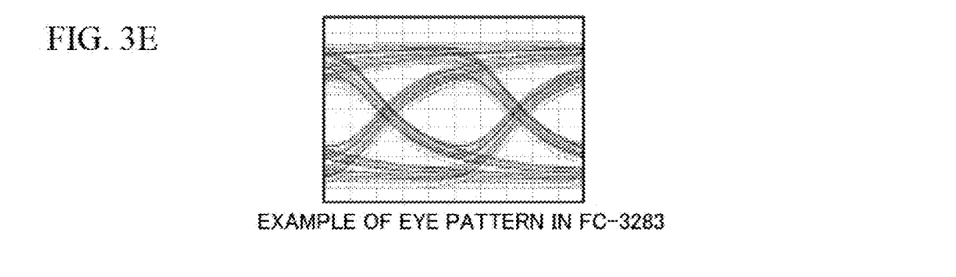

Next, referring to FIGS. 3A to 3E, transmission waveforms (i.e., eye patterns) are compared when the respective refrigerant liquids are used. Each of FIGS. 3A to 3E illustrates an example of the eye pattern acquired by using the electronic device that performs the transmission at a certain frequency. FIG. 3A illustrates an example of the eye pattern in the air. FIG. 3B illustrate an example of the eye pattern in a state where the electronic device is immersed in the M-20E. FIG. 3C illustrate an example of the eye pattern in a state where the electronic device is immersed in the vegetable oil A. FIG. 3D illustrate an example of the eye pattern in a state where the electronic device is immersed in the vegetable oil B. FIG. 3E illustrate an example of the eye pattern in a state where the electronic device is immersed in the FC-3283.

When the FC-3283 is used, an eye pattern almost similar to the eye pattern in the air can be acquired. Alternatively, when the M-20E is used, an eye pattern of the M-20E has a rate of change of around 5%, compared with the eye pattern in the air, and hence it is possible to secure the performance of the electronic device. On the contrary, in the vegetable oils A and B, the rate of change is large, and degradation of the performance of the electronic device is confirmed. According to these evaluations, it is hard to adopt the vegetable oils A and B as the refrigerant liquid.

For this reason, in the present embodiment, the M-20E which is the silicone oil-based insulating refrigerant is adopted as the refrigerant liquid 14.

Figure 4:
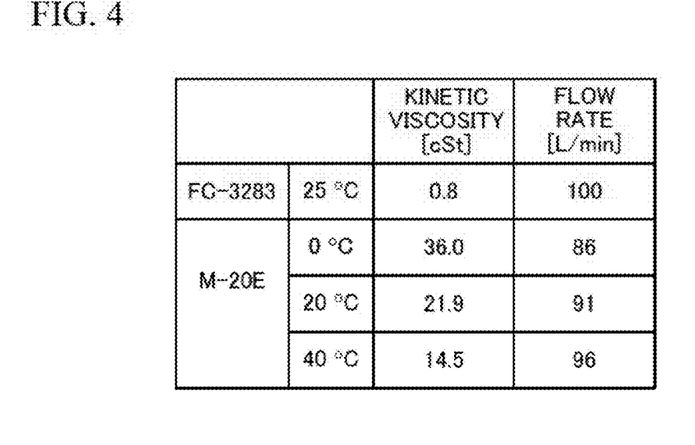
FIG. 4 is a table illustrating kinetic viscosities and flow rates of the refrigerant liquid used for the liquid immersion cooler according to the embodiment and refrigerant liquids of the comparative examples.

Next, a description will be given of the temperature of the silicone oil-based insulating refrigerant. Referring to FIG. 4, the kinetic viscosity at 25° C. with respect to the FC-3283 is 0.8 cSt, and the flow rate in a device with which a certain pump (e.g. magnet pump) is equipped is 100 L/min. When the same device is used and the refrigerant liquid is changed to the M-20E, the kinetic viscosity at 0° C. is 36.0 cSt and the flow rate is 86 L/min. Also, the kinetic viscosity at 20° C. is 21.9 cSt and the flow rate is 91 L/min. Moreover, the kinetic viscosity at 40° C. is 14.5 cSt and the flow rate is 96 L/min.

The electronic device 32 can operate at −5-50° C., but in the electronic device 32 to which high reliability is required, the range of 0-40° C. becomes a practical use domain. Therefore, the temperature of the refrigerant liquid 14 of the present embodiment is managed at the range of 0-40° C. to observe the operation guarantee temperature of the electronic device 32. In the M-20E in such a temperature range, reduction of a slight flow rate is seen in comparison with the FC-3283, but it is confirmed that the flow rate almost similar to the FC-3283 can be secured. This comparison is performed by using the magnet pump having a small driving force with respect to both of the M-20E and the FC-3283. Therefore, if the magnet pump having a large driving force is adopted when the M-20E is adopted, it is possible to secure the same flow rate as the FC-3283.

Figure 5:
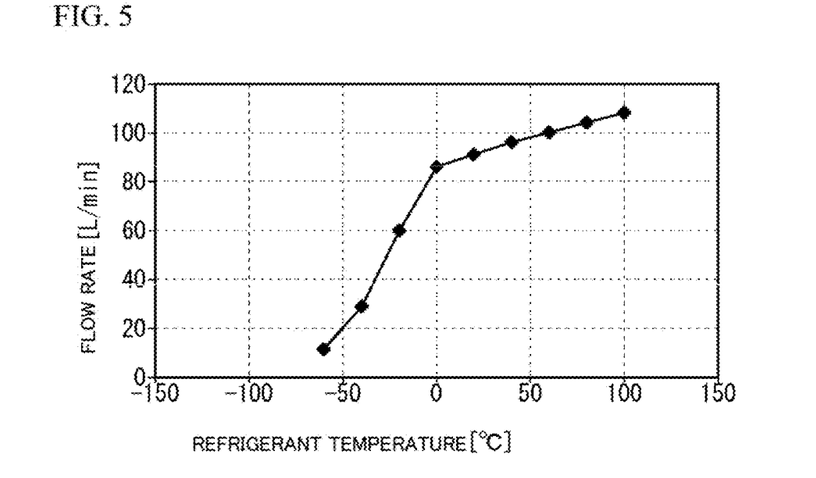
FIG. 5 is a graph illustrating a relationship between a temperature and a flow rate of the refrigerant liquid used for the liquid immersion cooler according to the embodiment.

FIG. 5 is a graph illustrating a relationship between the temperature and the flow rate of the M-20E. In the range of the temperature of this graph, the range of the temperature described in the table of FIG. 4 is also included. Referring to FIG. 5, it is confirmed that when the temperature enters into the range of the temperature lower than 0° C., a ratio of decrease of the flow rate becomes large. When the flow rate decreases due to the characteristic of the refrigerant liquid 14, it is possible to enhance the output of the pump 17 to make up for the decrease. However, when the output of the pump 17 is enhanced, an energy consumption required for the driving of the pump increases by an enhanced amount of output. Thus, also from the point of view of securing the flow rate efficiently, it is desirable to set the temperature of the refrigerant liquid 14 to 0° C. or more and operate the liquid immersion cooling system 10.

Thus, the M-20E can facilitate the operation of the liquid immersion cooling system 10.

Here, the silicone oil-based insulating refrigerant is stored into the refrigerant tank 20 in large quantities. For this reason, from the point of view of securing safety, it is demanded that it is hard to catch fire from the refrigerant liquid. The higher a flash point of the refrigerant liquid is, the harder it is to catch fire, and it is true that the refrigerant liquid having a high flash point is safe. When the installation environment of the liquid immersion cooling system 10 is usually considered, it is thought that the safety can be secured if the flash point is equal to or more than 250° C. The flash point of the M-20E of the present embodiment is 268° C., and the M-20E meets the above-mentioned condition. Here, also in the Fire Service law in Japan, the articles having the flash point equal to or more than 250° C. are out of the designation of dangerous materials, and are classified into flammable liquids. Therefore, when the silicone oil-based insulating refrigerant having the flash point equal to or more than 250° C. is adopted, it is easy to replace the fluorine-based insulating refrigerant with the silicone oil-based insulating refrigerant without changing the electronic device which has been already installed, and in the operation of the liquid immersion cooling system 10, the legal permission is also acquired easily.

According to the above-mentioned consideration, in the present embodiment, the silicone oil-based insulating refrigerant having the flash point equal to or more than 250° C. is adopted, and the liquid immersion cooling system 10 is operated at 0° C. or more.

Here, the silicone oil-based insulating refrigerant can be used for the liquid immersion cooling system for which the fluorine-based insulating refrigerant is used. That is, the silicone oil-based insulating refrigerant in which an interatomic bond is strong is filled up instead of the fluorine-based insulating refrigerant, and the liquid immersion cooling system can be operated. That is, the silicone oil-based insulating refrigerant has high versatility to the liquid immersion cooler.

According to the liquid immersion cooler 12 of the present embodiment, the silicone oil-based insulating refrigerant is adopted as the refrigerant liquid, so that the weight of the liquid immersion cooling system 10 can be reduced and the setting thereof becomes easy. Also, the range of selection of the pump is widened. As a result, the flexibility of the design is widened. Moreover, the silicone oil-based insulating refrigerant is hard to evaporate, and the high airtightness is therefore unnecessary for the refrigerant tank 20. Also, the silicone oil-based insulating refrigerant is cheaper than the fluorine-based insulating refrigerant, and hence it is possible to suppress a cost at the time of the system introduction and a running cost. Due to these reasons, the liquid immersion cooler 12 of the present embodiment can facilitate the operation of liquid immersion cooling system 10.

Here, in the above-mentioned description, as an example of the silicone oil-based insulating refrigerant, the M-20E is explained, but other silicone oil-based insulating refrigerant may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A liquid immersion cooler comprising:
    a refrigerant tank that stores a silicone oil-based insulating refrigerant immersing an electronic device;
    a circulation passage that is provided between the refrigerant tank and a refrigerant cooler, and through which the silicone oil-based insulating refrigerant is circulated; and
    a pump that is arranged on the circulation passage, and circulates the silicone oil-based insulating refrigerant between the refrigerant tank and the refrigerant cooler,
    a first ratio of change of a first eye pattern of a waveform in case of being transmitted in the electronic device immersed in the silicone oil-based insulating refrigerant to a second eye pattern of a waveform in case of being transmitted in the electronic device located in air is within a prescribed range.

2. The liquid immersion cooler as claimed in claim 1, wherein the silicone oil-based insulating refrigerant is circulated in a state where a temperature of the silicone oil-based insulating refrigerant is equal to or more than 0° C. and a flow rate of the silicone oil-based insulating refrigerant is equal to or more than 86 liter/minute.

3. The liquid immersion cooler as claimed in claim 1, wherein a flash point of the silicone oil-based insulating refrigerant is equal to or more than 250° C.

4. The liquid immersion cooler as claimed in claim 1, wherein the prescribed range is equal to or less than 5%.

5. The liquid immersion cooler as claimed in claim 1, wherein the silicone oil-based insulating refrigerant is selected based on the first ratio of change and a second ratio of change of a third eye pattern of a waveform in case of being transmitted in the electronic device immersed in vegetable oil to the second eye pattern in air.

* * * * *